(12) United States Patent
Hebert

(10) Patent No.: US 9,980,414 B2
(45) Date of Patent: May 22, 2018

(54) CONVERTER ARRANGEMENT WITH A CAPACITOR ARRANGEMENT

(71) Applicant: Semikron Elektronik GmbH & Co., KG, Nürnberg (DE)

(72) Inventor: Mathieu Hebert, Maisons-Laffitte (FR)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days. days.

(21) Appl. No.: 14/683,900

(22) Filed: Apr. 10, 2015

(65) Prior Publication Data
US 2015/0296653 A1    Oct. 15, 2015

(30) Foreign Application Priority Data
Apr. 10, 2014  (DE) .......... 10 2014 105 114

(51) Int. Cl.
*H05K 7/20*    (2006.01)

(52) U.S. Cl.
CPC ..... *H05K 7/20918* (2013.01); *H05K 7/20909* (2013.01)

(58) Field of Classification Search
CPC ............. H05K 7/2089; H05K 7/20909; H05K 7/20918; H05K 7/20136–7/20163;
(Continued)

(56) References Cited

U.S. PATENT DOCUMENTS 3,389,311 A * 6/1968 Rayno .................... H01G 2/103
                                                            174/50.56

3,978,377 A * 8/1976 Constanti ................. H01G 9/10
                                                            361/520
(Continued)

FOREIGN PATENT DOCUMENTS

DE    10 2011 076 325 A1    11/2012
EP     1 610 452              12/2005
(Continued)

OTHER PUBLICATIONS

LCR Capacitors EU LTD , 'S' Series Nylon Mounting Clip for Tubular Capacitors, Apr. 19, 2009.*

*Primary Examiner* — Dion R Ferguson
*Assistant Examiner* — Amir Jalali
(74) *Attorney, Agent, or Firm* — The Law Offices of Roger S. Thompson

(57) ABSTRACT

A power converter arrangement comprising: a housing having first and second chambers separated by a separating body; a power semiconductor module; and a device. The capacitor is electrically conductively connected to power semiconductor module by a connecting device. Power semiconductor module, the connecting device and connection elements of the capacitor are arranged in first chamber. The capacitor reaches through the separating body between the first and second chambers into second chamber for cooling of the capacitor. The separating body has a first cutout through which the capacitor reaches. A flat, elastic sealing body which runs peripherally around the first cutout and reaches into the region of the first cutout and surrounds the capacitor there in sealing fashion, is arranged on a surface of the separating body. A pressing body presses the sealing body against the separating body and terminates in sealing fashion there.

20 Claims, 4 Drawing Sheets

(58) Field of Classification Search
CPC .......... H05K 2201/10015; H01L 23/46; H01L 23/473; H03H 2001/0042
USPC .............. 361/695–697, 734, 763, 821, 830; 363/141; 257/721–722; 174/547–548, 174/16.3; 165/80.3
See application file for complete search history.

(56) References Cited

U.S. PATENT DOCUMENTS

| | | | | |
|---|---|---|---|---|
| 5,245,513 | A * | 9/1993 | Maijers | H01G 9/10 361/520 |
| 6,265,661 | B1 * | 7/2001 | Schweikert | H01G 2/04 174/135 |
| 7,816,631 | B2 | 10/2010 | Cramer | |
| 8,570,767 | B2 * | 10/2013 | Schmit | H01G 2/04 248/27.3 |
| 8,654,545 | B2 * | 2/2014 | Zengerle | H01G 2/04 174/351 |
| 8,773,851 | B2 * | 7/2014 | Shigeno | H05K 7/20918 165/185 |
| 8,870,599 | B2 * | 10/2014 | Takemoto | H01R 13/6625 439/620.21 |
| 9,245,686 | B2 * | 1/2016 | Sevakivi | H01G 4/28 |
| 2004/0090752 | A1 * | 5/2004 | Janicek | H01C 1/022 361/738 |
| 2008/0130223 | A1 * | 6/2008 | Nakamura | H02M 7/003 361/689 |
| 2009/0002942 | A1 * | 1/2009 | Seifert | H01G 2/04 361/694 |
| 2009/0295027 | A1 * | 12/2009 | Kindig | H05K 3/284 264/272.14 |
| 2010/0195271 | A1 * | 8/2010 | Abe | H01G 9/12 361/519 |
| 2011/0038133 | A1 * | 2/2011 | McNamara | H05K 3/301 361/760 |
| 2012/0077010 | A1 * | 3/2012 | Manesis | B29C 67/20 428/220 |
| 2012/0077012 | A1 * | 3/2012 | Liu | B29C 67/202 428/221 |
| 2012/0077356 | A1 * | 3/2012 | Shimizu | H01G 2/06 439/55 |
| 2012/0081835 | A1 * | 4/2012 | Shimizu | H01G 2/06 361/306.1 |
| 2012/0262877 | A1 * | 10/2012 | Nagano | H01G 2/10 361/690 |
| 2012/0262968 | A1 * | 10/2012 | Nagano | H02M 7/003 363/141 |
| 2012/0262969 | A1 * | 10/2012 | Nagano | H05K 7/20909 363/141 |
| 2014/0313806 | A1 | 10/2014 | Shinohara et al. | |

FOREIGN PATENT DOCUMENTS

JP         H10-150284       6/1998
JP         2013-094022 A    10/2011

\* cited by examiner

CONVERTER ARRANGEMENT WITH A CAPACITOR ARRANGEMENT

BACKGROUND OF THE INVENTION

1. Field of the Invention

The invention is directed to a power converter arrangement comprising a capacitor device positioned in a housing having at least two chambers, wherein one of the chambers is designed to have cooling air flowing through it and, as a result, cools the capacitor device.

2. Description of the Related Art

The prior art disclosed in European Patent No. EP 1 610 452 A2 discloses an inverter comprising a housing and a cooling assembly for cooling the electrical components. The housing of the inverter has at least two chambers, separated by a wall for accommodating the lossy components. When these components have heat sinks, the components are located on one side of the wall in the one chamber and the heat sinks are located on the other side of the wall in the other chamber. When the electrical component to be cooled itself has a high degree of protection, this component is located in the other chamber, preferably on the wall side of the wall of the other chamber, wherein the other chamber has the cooling assembly.

SUMMARY OF THE INVENTION

It is an object of the invention is to provide an improved power converter arrangement for cooling such an arrangement with a capacitor device.

The inventive power converter arrangement has a housing with at least two chambers, wherein the arrangement of the components of the power converter arrangement to be cooled is improved and, at the same time, the two chambers are sealed off effectively from one another.

The inventive power converter arrangement comprises a housing having first and second chambers. Second chamber is separated from the first chamber by a separating body. The arrangement further comprises a power semiconductor module and a capacitor device, which is electrically conductively connected to the power semiconductor module by a connecting device, the capacitor device having connection elements. In this case, the power semiconductor module, the connecting device and the connection elements of the capacitor device are arranged in the first chamber, wherein the capacitor device reaches through the separating body between the first and second chambers into second chamber for cooling the capacitor device. The separating body has a first cutout through which the capacitor device reaches. A flat, elastic sealing body 1) is arranged on a surface of the separating body; 2) runs peripherally around the first cutout; and 3) reaches into the region of the first cutout and surrounds the capacitor device there in sealing fashion. A pressing body presses the sealing body against the separating body and terminates in sealing fashion there.

Of course in particular the terms "sealing body", "power semiconductor module", "connecting device" and "connection element" are also understood to mean one or more of these elements, even with different functionalities. The term "capacitor device" is understood to mean one or more capacitors, if more than one, it is preferred that the plural capacitors be connected in parallel.

It is particularly preferred if the first cutout in the separating body has a greater diameter than the combination of the capacitor device together with the sealing body lying thereon. This of course relates to the corresponding diameter of the capacitor device at that point at which the capacitor device reaches through the separating body.

It may be preferred if the sealing body, owing to its elastic formation, forms a first sealing surface with the capacitor device and is therefore connected to the capacitor device in a form-fitting manner. Preferably at the same time, the sealing body can be connected in a force-fitting manner to the separating body on a second sealing surface by the pressing body.

Preferably, second chamber is designed to have cooling air flowing through it.

In addition, the power semiconductor module can be arranged on a cooling device, which reaches into second chamber and is arranged there, wherein the cooling device is arranged in sealing fashion from second chamber towards the first chamber.

Preferably, the separating body is in the form of a separating metal sheet or a metallic molded body consisting of a U-shaped metal sheet, whose side walls form the walls of the first or second chamber.

The sealing body is preferably in the form of an elastic material, more preferably an elastomer, having a modulus of elasticity of between about 1.0 MPa and about 3.5 MPa, preferably between about 1.8 MPa and about 2.5 MPa. Preferably, the sealing body has a thickness of between about 0.2 mm and about 3.0 mm, preferably between about 1.4 mm and about 2.0 mm.

In an advantageous configuration, the capacitor device is surrounded in sealing fashion by the sealing body over a length of between about 2 mm and about 30 mm, preferably between about 10 mm and about 25 mm. Likewise preferably, the capacitor device has a round or oval cross section in that region which is surrounded by the sealing body and where a first sealing surface is formed.

An advantageous configuration results when an actuation device which is electrically connected to the power semiconductor module, and preferably at the same time a sensor device, are arranged in the first chamber.

It goes without saying that the various configurations of the invention, i.e. the power converter arrangement, can be implemented individually or in any desired combinations in order to achieve improvements. In particular, the features mentioned above and explained here or in the text which follows can be used not only in the combinations specified, but also in other non-exclusive combinations or on their own without departing from the scope of the present invention.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
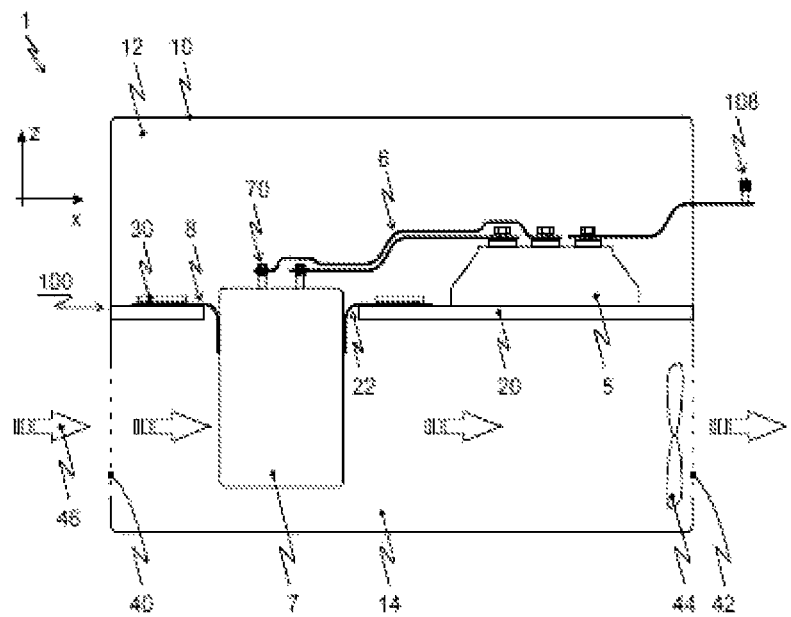
FIG. 1 shows, schematically, a power converter arrangement according to the invention.

FIG. 1 shows, schematically, a power converter arrangement 1 according to the invention. The power converter arrangement in this case has a housing 10, which is divided into first and second chambers 12, 14, respectively, by a separating body 20. The two chambers 12, 14 in this configuration are separated from one another in a dust-tight and moisture-tight manner in accordance with IP 54. In this case, components such as a power semiconductor module 5, which only has a low level of resistance to rough ambient conditions such as humidity or dust, are located in first chamber 12. The cooling device which may be required for this power semiconductor module 5 can additionally be arranged in second chamber 14.

Figure 2:
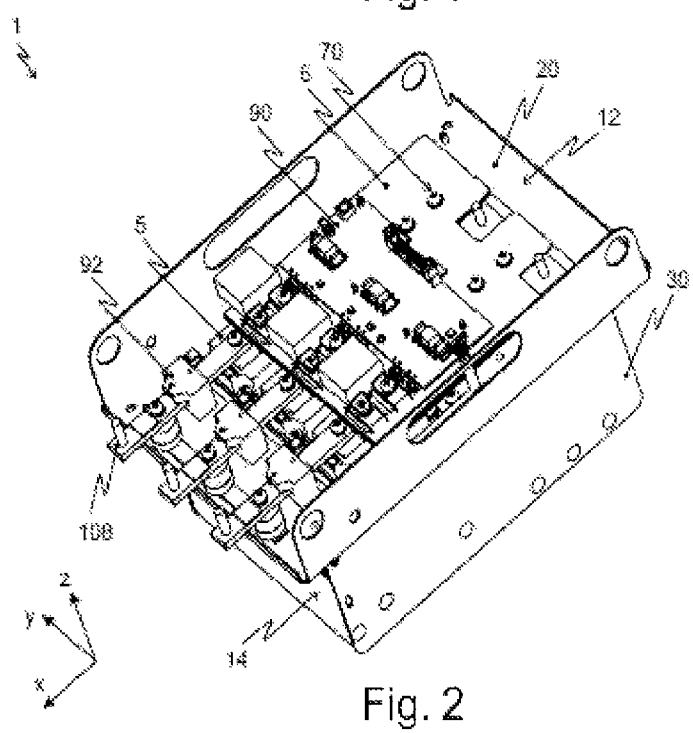
FIGS. 2 to 5 show a power converter arrangement according to the invention or parts thereof.

In addition, but not shown here but in FIG. 2, current sensors are also arranged in first chamber 12 on external connection elements 108 and an actuation device 90 for the power semiconductor module can be arranged in first chamber 12, actuation device 90 is often likewise not designed for rough ambient conditions.

Components which, either at the same time or alternatively, have a high cooling requirement or are designed for rough ambient conditions are located in second chamber 14. For this purpose, second chamber 14 has cooling air inlets 40 and outlets 42 so that this second chamber 14 can have cooling air 46 flowing through it by a fan 44 and thus components arranged there can be cooled. Such components are in particular the capacitor device 7, at least a substantial part thereof, but also, as mentioned above, the cooling device of the power semiconductor module.

Power semiconductor module 5 of the power converter arrangement 1 is electrically connected to connection elements 70 of capacitor device 7 by a connecting device 6. These connection elements 70 and a small part of the capacitor body of capacitor device 7 are arranged in first chamber 12, while the majority of the capacitor body is arranged in second chamber 14 for cooling of the capacitor body. The capacitor body therefore reaches from first chamber 12 into second chamber 14.

In accordance with the invention, first chamber 12 of housing 10 is sealed off from second chamber 14 by an elastic sealing body 8 assigned to capacitor device 7. For this purpose, a separating body 20 is provided, which in this case completely separates first chamber 12 from second chamber 14, but has a first cutout 22, through which capacitor device 7 reaches from first chamber 12 into second chamber 14. For dust-tight and moisture-tight separation of first chamber from second chamber, sealing body 8 surrounds first cutout 22 of separating body 20 and protrudes into first cutout 22 so that that part of capacitor device 7 which is arranged there is surrounded in a form-fitting and sealing manner by sealing body 8.

For the further configuration of the sealing, a pressing body 30 is provided. Pressing body 30 presses sealing body 8 flat against separating body 20, more precisely against its surface. As a result of this and as a result of the fact that sealing body 8 bears in sealing fashion against capacitor device 7, first and second chambers 12, 14, respectively, are sealed off from one another. FIGS. 2 to 5 show a power converter arrangement 1 according to the invention or parts thereof. FIG. 2 shows the power converter arrangement 1 which in this case is in the form of a three-phase inverter, without a housing, with a view onto first chamber 12. In this first chamber 12, three power semiconductor modules 5 are arranged, each having a respectively assigned external connection element 108, which is assigned to one of the three phases in this case. These connection elements in this case each bear a current sensor 92 for measuring the intensity of the present alternating current. Furthermore, power semiconductor modules 5 are electrically connected by connecting device 6, which is in the form of a flat DC busbar in this case. Connecting device 6 connects power semiconductor modules 5 to connection elements 70 of capacitor device 7. In addition, an actuation device 90 is illustrated above power semiconductor modules 5. These mentioned components, with the exception of capacitor device 7, are located in first chamber 12 of power converter arrangement 1.

A cooling device of power semiconductor modules 5 and essential parts of capacitor device 7 are located in second chamber 14 (not shown in FIG. 2). This second chamber 14 is designed for allowing a flow of cooling air therethrough, similar to FIG. 1.

Figure 3:
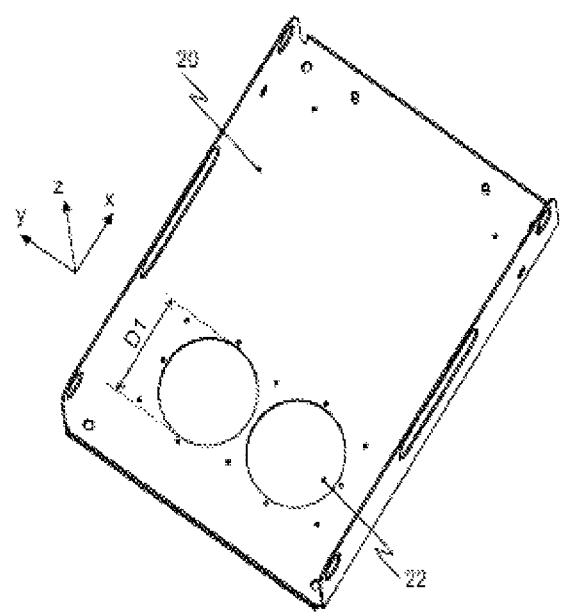
Figure 5:
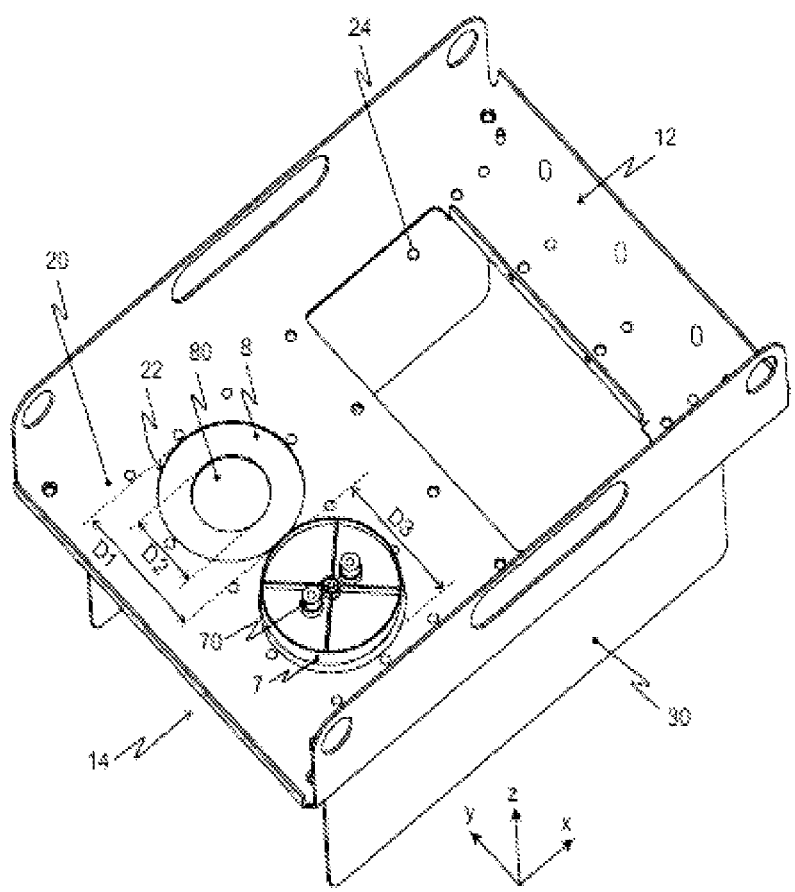

First chamber 12 is separated from second chamber 14 by separating body 20, which in this case is formed by a U-shaped metal sheet, illustrated in detail in FIG. 3 and in an alternative configuration in FIG. 5.

The respective separating body 20 has two first cutouts 22 with a first diameter D1. In each case, one capacitor body of capacitor device 7 is arranged in these first cutouts 22. The capacitor body has, in the region of first cutout 22, a cross-section which corresponds to this cutout 22, in this case a round cross-section, and a third diameter D3, which is smaller than the first diameter D1 of first cutout 22.

Figure 4:
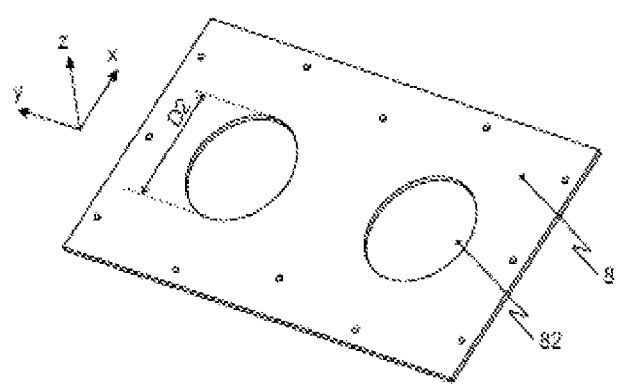

For sealing purposes, a sealing body 8 as shown in FIG. 4 is arranged on that surface of the separating body 20 which is remote from first chamber 12 and is pressed in sealing fashion against the separating body 20 by a pressing body 30. This pressing body 30 is likewise in the form of a U-shaped metal sheet, wherein the side walls of the two U-shaped metal sheets protrude away from one another and at least partially form the side walls of the respective chamber. Pressing body 30 for its part has a third cutout which corresponds to first cutout 22 in separating body 20, in this case advantageously has the same diameter and is arranged so as to be aligned with first cutout 22 in separating body 20.

Sealing body 8 for its part has two cutouts 80 corresponding to and aligned with first cutout 22 in separating body 20, wherein this second cutout 80 in sealing body 8 has a second diameter D2, which is smaller than the third diameter D3 of the capacitor body.

Sealing body 8 itself is formed from an elastomer with a modulus of elasticity of 2.1 MPa±about 0.1 MPa and a thickness of 1.6 mm±about 0.2 mm. Owing to the arrangement of the capacitor bodies centrally in first cutout 22 in separating body 20 with sealing body 8 arranged, that part of sealing body 8 which is adjacent to second cutout 80 surrounds the capacitor body. This results in a first sealing surface 82 between sealing body 8 and capacitor device 7; cf. FIG. 6 or 7. A second sealing surface 84 is produced between separating body 20 and sealing body 8 when pressing device 30 is arranged. Overall, therefore, a dust-tight and moisture-tight sealing of first chamber 12 from second chamber 14 of power converter arrangement 1 is provided.

Power semiconductor modules 5 are arranged on a separating body 20 as shown in FIG. 3 and are coupled thermally to a cooling device in second chamber 14 through separating body 20. Alternatively, separating body 20, as illustrated in FIG. 5, may have a further cutout 24, which is closed in sealing fashion by a cooling device together with power semiconductor modules arranged thereon. For this purpose, the cooling device is fastened on that surface of separating body 20 which is remote from first chamber 12 and has a sealing device conventional in the art (not illustrated) running peripherally around cutout 24. Power semiconductor modules 5 are in this case arranged on that surface of the cooling device which faces first chamber 12 and are therefore located in first chamber 12.

Figure 6:
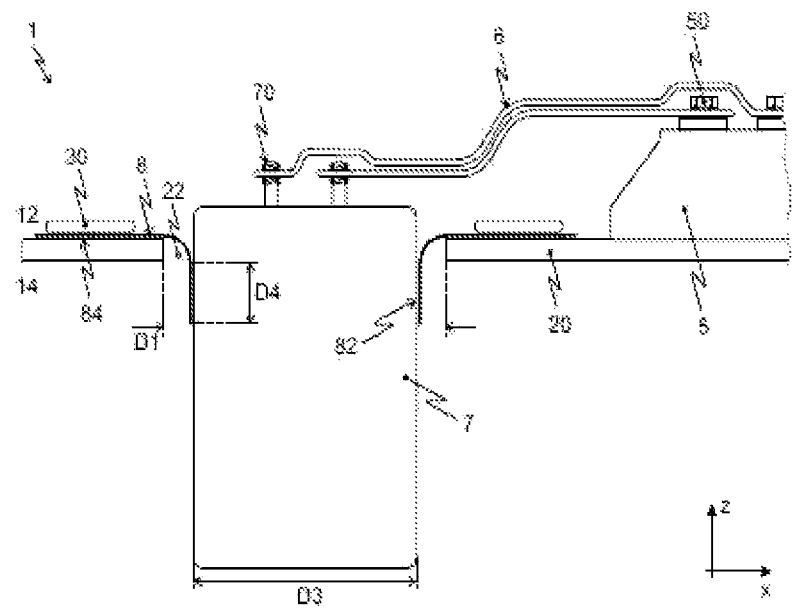
FIGS. 6 and 7 each show an embodiment of a power converter arrangement according to the invention in a partial view.
Figure 7:
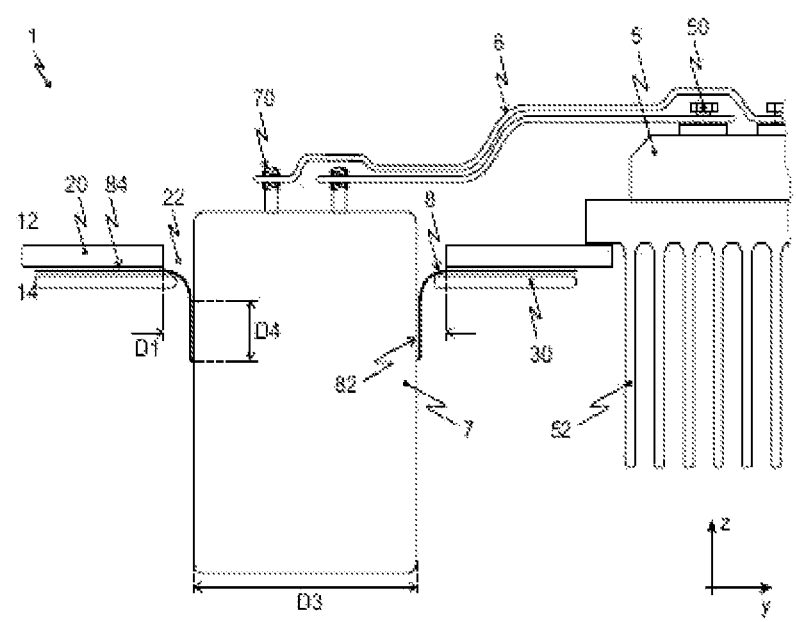

FIGS. 6 and 7 each show an embodiment of a power converter arrangement 1 according to the invention in a partial view. In each case, one capacitor device 7 comprising connection elements 70 is illustrated. These connection elements 70 are connected to assigned connection devices 50 of power semiconductor module 5 by connecting device 6. This is in principle a configuration of an inverter which is conventional in the art comprising a DC link and a power semiconductor module.

As illustrated in FIG. 6, power semiconductor module 5 is arranged on a separating body 20, which separates the first, in this case upper, chamber 12 of power converter arrangement 1 from the second, in this case lower, chamber 14. Separating body 20 has a first cutout 22, which has a first diameter D1. A capacitor device 7 is arranged in this first cutout 22 so that the upper parts of all of the assigned connection elements 70 are located in first chamber 12, while the lower larger part of capacitor device 7 to be cooled is located in second chamber 14.

For the dust-tight and moisture-tight separation of first chamber 12 from second chamber 14, a sealing body 8 is provided. Elastic sealing body 8 is flat and rests on that surface of separating body 20 which faces first chamber 12. Sealing body 8 is pressed onto the separating body 20 in sealing fashion and therefore seals off sealing body 8 in a force-fitting manner at a second sealing surface 84 by means of a pressing device 30 arranged thereon.

Since second cutout 80, in sealing body 8, is arranged so as to be aligned with first cutout 22 in separating body 20 and has a second diameter D2, which is smaller than diameter D3 of capacitor device 7 in this region, part of sealing body 8 surrounds capacitor device 7 at a first sealing surface 82 and therefore positively seals off first chamber 12 from second chamber 14 over a length D4 of 20 mm±about 2 mm at capacitor device 7

Power semiconductor module 5 shown in FIG. 7 is arranged on a surface of a cooling device 52, whose flat partial body overlaps a further cutout 24 in separating body 20 and is sealed off, in a manner conventional in the art, from second chamber 14. The cooling elements, for example in the form of cooling fins or cooling fingers, of cooling device 52 protrude into second chamber 14 and can therefore be cooled with the same cooling air 46 that is also used for cooling capacitor device 7, more precisely as the part which protrudes into second chamber 14.

As shown in FIG. 7, sealing body 8 is arranged on that surface of separating body 20 which faces second chamber 14 and is pressed onto this second surface there by a pressing device 30. Pressing device 30 in this case has an assigned cutout with a slightly smaller diameter than that of first cutout 20.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power converter arrangement comprising:
    a housing having first and second chambers;
    a separating body for separating said first and second chambers, said separating body having a cutout;
    a power semiconductor module disposed in said first chamber;
    a capacitor device having connection elements disposed in said first chamber, said capacitor device being disposed to reach through said cutout of said separating body into said second chamber for cooling of said capacitor device;
    a connecting device for electrically conductively connecting said power semiconductor module to said capacitor device, said connecting device being disposed in said first chamber;
    a flat elastic sealing body which runs peripherally around said cutout and is arranged on a surface of said separating body, said sealing body reaching into an opening of said cutout and surrounding said capacitor device there in sealing fashion, said flat sealing body extending outwardly from said opening; and
    a sheet-like pressing body which presses said flat sealing body against said separating body and terminates in sealing fashion there.

2. The power converter arrangement of claim 1, wherein said cutout has a diameter which is greater than a diameter of said capacitor device together with said sealing body lying thereon.

3. The power converter arrangement of claim 1, wherein said sealing body forms a first sealing surface with said capacitor device and is thereby connected to said capacitor device in a form-fitting manner.

4. The power converter arrangement of claim 1, wherein said pressing body is configured to force-fittingly connect said sealing body to said separating body on a second sealing surface.

5. The power converter arrangement of claim 1, wherein said second chamber is configured to receive cooling air and to permit said cooling air to flow through it.

6. The power converter arrangement of claim 1, further comprising a cooling device, said cooling device being disposed so as to reach into said second chamber and to receive said power semiconductor module thereon, said cooling device sealing said second chamber from said first chamber.

7. The power converter arrangement of claim 1, wherein said separating body is formed as a metallic molded body which includes a U-shaped metal sheet, whose side walls form walls of at least one of said first and second chambers.

8. The power converter arrangement of claim 1, wherein said sealing body is made of an elastomer, having a modulus of elasticity of between about 1.0 MPa and about 3.5 MPa.

9. The power converter arrangement of claim 1, wherein said sealing body has a modulus of elasticity of between about 1.0 MPa and about 3.5 MPa.

10. The power converter arrangement of claim 9, wherein said modulus of elasticity of said sealing body is between about 1.8 MPa and about 2.5 MPa.

11. The power converter arrangement of claim 1, wherein said sealing body has a thickness of between about 0.2 mm and about 3.0 mm.

12. The power converter arrangement of claim 11, wherein said sealing body has a thickness of between about 1.4 mm and about 2.0 mm.

13. The power converter arrangement of claim 1, further comprising an actuation device which is electrically connected to said power semiconductor module and is disposed in said first chamber.

14. The power converter arrangement of claim 13, further comprising a sensor device which is disposed in said first chamber.

15. The power converter arrangement of claim 1, further comprising a sensor device which is disposed in said first chamber.

16. The power converter arrangement of claim 1, wherein said capacitor device is surrounded in sealing fashion by said sealing body over a length of between about 2 mm and about 30 mm.

17. The power converter arrangement of claim 16, wherein said length over which said capacitor device is surrounded by said sealing body is between about 10 mm and about 25 mm.

18. The power converter arrangement of claim 1, wherein said capacitor device has a generally round cross-section in that region thereof which is surrounded by said sealing body and where a first sealing surface is formed.

19. The power converter arrangement of claim 1, wherein said capacitor device has a generally oval cross-section in that region thereof which is surrounded by said sealing body and where a first sealing surface is formed.

20. The power converter arrangement of claim 1, wherein said sealing body reaches inwardly into said region of said cutout from edges of said cutout, and has an open cross-section which is less than a cross-section of said cutout.

* * * * *